United States Patent [19]
Navabi et al.

[11] Patent Number: 5,585,763
[45] Date of Patent: Dec. 17, 1996

[54] CONTROLLED IMPEDANCE AMPLIFIER

[75] Inventors: Mohammad J. Navabi; Baker P.L. Scott, III; Stephen F. Bily, all of Austin, Tex.

[73] Assignee: Crystal Semiconductor Corporation, Austin, Tex.

[21] Appl. No.: 413,994

[22] Filed: Mar. 30, 1995

[51] Int. Cl.⁶ .................................................. H03F 3/26
[52] U.S. Cl. ......................... 330/255; 330/260; 330/265
[58] Field of Search ................................. 330/253, 255, 330/260, 264, 265

[56] References Cited

U.S. PATENT DOCUMENTS

| | | | |
|---|---|---|---|
| 4,349,788 | 9/1982 | Sondermeyer | 330/293 |
| 4,593,252 | 6/1986 | Korn | 330/260 |
| 4,959,623 | 9/1990 | Khoury | 330/264 X |
| 5,121,080 | 6/1992 | Scott, III et al. | 330/260 |
| 5,157,349 | 10/1992 | Babenezhad | 330/253 |
| 5,210,506 | 5/1993 | Koch et al. | 330/264 X |

FOREIGN PATENT DOCUMENTS

| | | |
|---|---|---|
| 52-50148 | 4/1977 | Japan . |
| 56-43833 | 4/1981 | Japan . |

OTHER PUBLICATIONS

Babenezhad, Joseph N.; "A Low–Output–Impedance Fully Differential Op Amp with Large Output Swing and Continuous–Time Common–Mode Feedback", *IEEE Journal of Solid–State Circuits*, vol. 26, No. 12, Dec. 1991.

*Primary Examiner*—Steven Mottola
*Attorney, Agent, or Firm*—Arnold, White & Durkee

[57] ABSTRACT

An amplifier with controlled output impedance utilizing current and voltage feedback to set gain and output impedance is disclosed. The voltage feedback is provided by feedback resistor connected from the output to the inverting input. The current feedback is provided by feeding a current proportional to the output current directly to the inverting input of the amplifier. An error amplifier is used to maintain the proper ratio of the current feedback to the output current and to cancel the effects of the output device impedance on the overall output impedance. Two such amplifiers driven by complimentary signals form a differential amplifier with controlled output impedance. Because the output impedance is a function of the voltage feedback resistance and the current feedback ratio, it is possible to digitally control the output impedance by changing the feedback resistance and/ or the current feedback ratio.

51 Claims, 10 Drawing Sheets

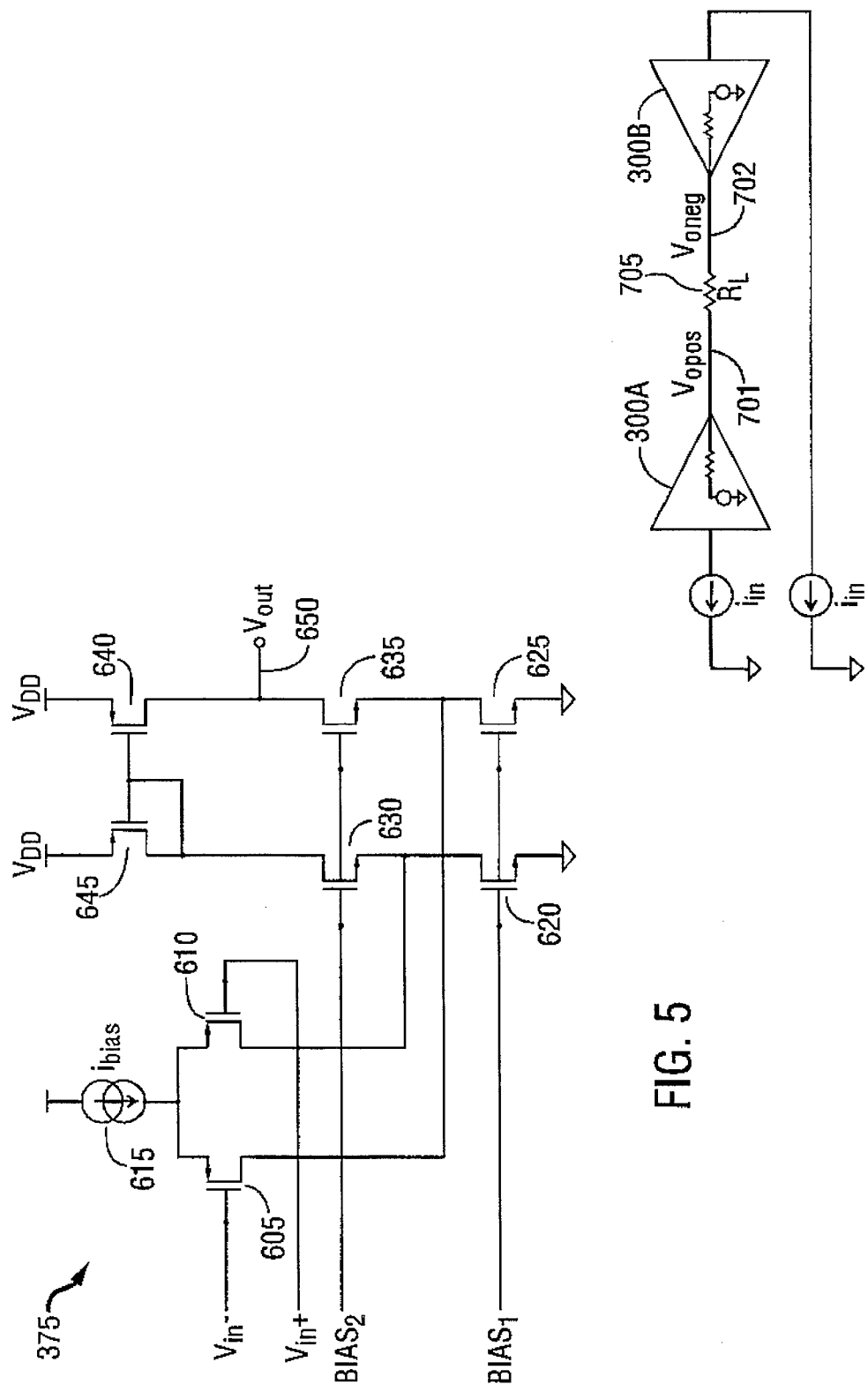

5,585,763

CONTROLLED IMPEDANCE AMPLIFIER

BACKGROUND OF THE INVENTION

The present application pertains to integrated circuit amplifier circuits, and more particularly, to line drivers with controlled output impedance.

When utilizing a line driver for sending signals over transmission lines, it is often necessary to match the characteristic impedance of the line in order to avoid reflections and ringing. Transmission line impedances in the range of 50 to 200 Ohms are commonly used. Additionally, transformers with different turn ratios are often needed which results in a wider range of reflected line impedances to be matched by the line driver. Various approaches are used to match the impedance of the line driver and the transmission line.

One approach matches the impedance by driving the line with either an ideally zero impedance amplifier in series with a resistor or an ideally infinite impedance amplifier in parallel with a resistor. This approach has the disadvantage of a substantial increase in the power consumption due to power dissipated by the added resistor. The alternative is to design an amplifier with a finite output impedance equal to the characteristic impedance of the transmission line. To be able to use such an amplifier with different transmission lines or transformers, its output impedance should be programmable. Thus, it would be desirable to have a programmable output impedance amplifier.

One technique for implementing a controlled impedance driver utilizes an amplifier with voltage and current feedbacks as shown in FIGS. 1(a) and 1(b) and disclosed in U.S. Pat. No. 5,121,080 by Scott and Swanson, the disclosure of which is expressly incorporated herein by reference. An amplifier 200 with two current outputs is used. The current from the first output 210 is set proportional to the second output 220. The first output 210 is coupled to the inverting input of the amplifier, providing the current feedback path. The second output 220 provides the amplifier's output and is coupled to the inverting input of the amplifier by a feedback conductance $g_f$. By proper selection of the feedback resistance and the current feedback ratio, the gain and the output impedance are set.

The output impedance in Scott and Swanson is a function of the current ratio as well as the feedback resistor value and therefore this approach utilizes a constant ratio between the current feedback and the output current. In order for the feedback current to be a constant proportion of the output current either high output impedance devices should be used for both outputs so that its Ids is not a function of Vds, or the Vds of the two output devices 230 and 240 must track. Long channel length devices have larger output impedance and could be used in devices 230 and 240, but the longer channel length increases gate capacitance and also uses more silicon area. Cascocling is a common technique for buffering the drain of a current mirror from voltage variations, but the stacking of devices limits the amount of output signal swing and again increases silicon area. To force the two output voltages to track, a resistor $R_d$ was placed in the current feedback path (as shown in FIG. 1(b)) so that output current variations create similar variations in the two output voltages. While this approach is adequate for the signals driven by the amplifier, if a reflected signal from the line side reaches the amplifier's second output the resulting change in current will force the voltage of the first output in the opposite direction. If in the presence of reflected signals the two voltages do not adequately track, a change in the ratio of feedback current to output current may result, which in turn results in a change in output impedance.

Further this single ended controlled impedance driver may not be able to adequately tolerate reflections from the line when driving outputs near zero. For example, if the amount of current needed to maintain a constant output impedance in presence of reflections is greater and opposite polarity compared to the current flowing in the output of the amplifier, the amplifier may turn off completely.

Another complication resulting from the added resistor $R_d$ is that the resister makes programmability of the output impedance more difficult. The output impedance is a function of the resistor $R_d$ and for different line impedances a different value of $R_d$ should be used. To match different line impedances, different transformers were used to create the characteristic impedance reflected to the driver. However, the disadvantage of this approach is the need for hardware modification.

Thus, it would be desirable to design an amplifier with controlled output impedance even in the presence of reflected signals. Furthermore, it is desirable that such an amplifier be easily programmed for various line impedances without having to make hardware changes.

SUMMARY OF THE INVENTION

A controlled impedance amplifier which maintains its output impedance at all operating levels and in the presence of reflected signals is disclosed. An amplifier with two proportional current outputs is designed. The first output is cascoded and coupled to the inverting input of the amplifier providing a current feedback path. The second output which forms the amplifier's controlled impedance output, is coupled to the inverting input of the amplifier by a feedback resistance. The cascode of the first output is linked by an error amplifier to the second output. This ensures that the voltages at the output devices are tracking. The error amplifier controls the gate voltage of the cascoding device in the first output. By proper selection of the feedback resistor and feedback current ratio, gain and output impedance of the amplifier are set. By digital control of the first and/or second output device sizes, the current feedback ratio can be adjusted to allow for selection of different output impedances. The value of the feedback resistor is also digitally controlled to allow for a wider output impedance selection range.

BRIEF DESCRIPTION OF THE DRAWINGS

FIG. 5 shows the error amplifier used on the n-channel side of the amplifier shown in FIG. 2.

FIG. 6 is a differential implementation of the controlled impedance amplifier according to the present invention.

DETAILED DESCRIPTION

Figure 1B:
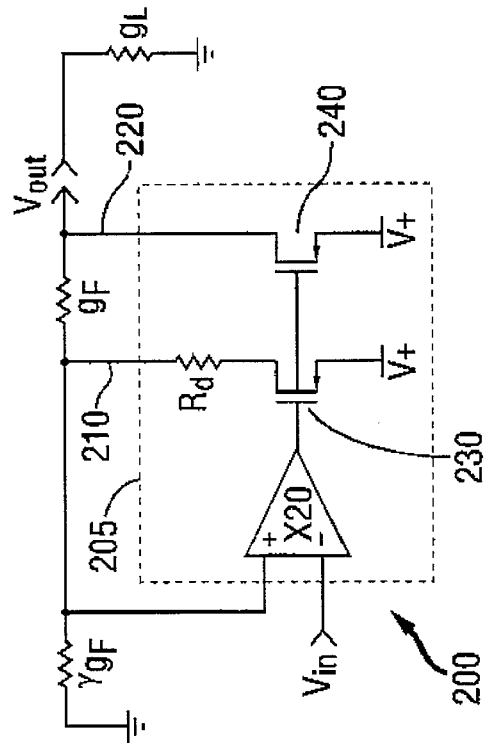
FIGS. 1(a) and 1(b) are block diagrams of a prior art controlled impedance amplifier.
Figure 1A:
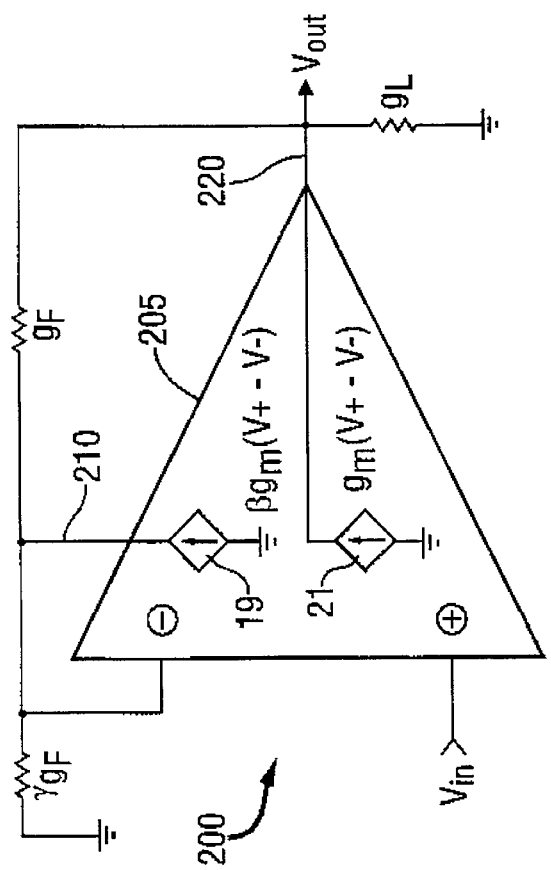
Figure 2:
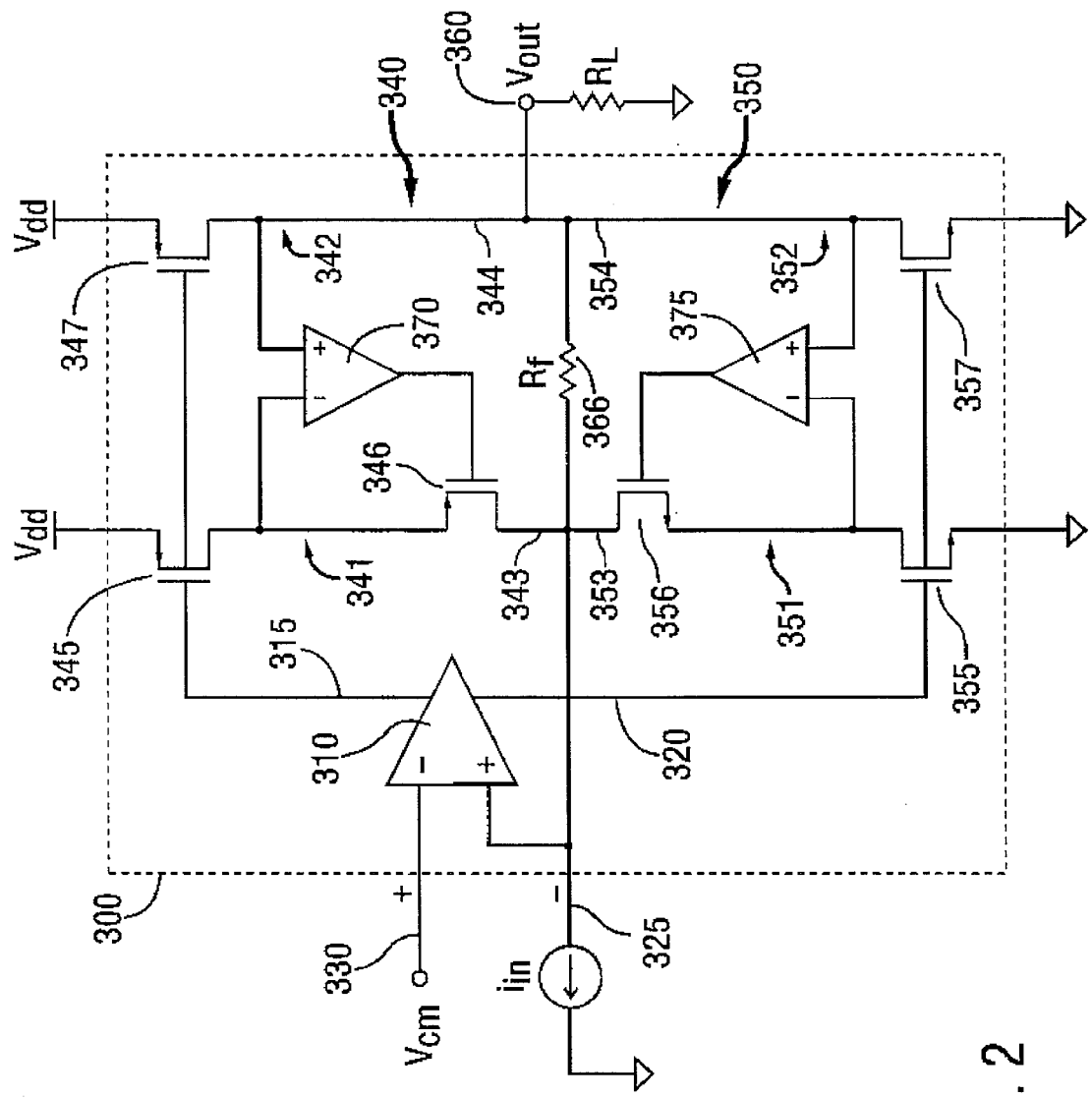
FIG. 2 is a block diagram of a controlled impedance amplifier according to the present invention.
Figure 2A:
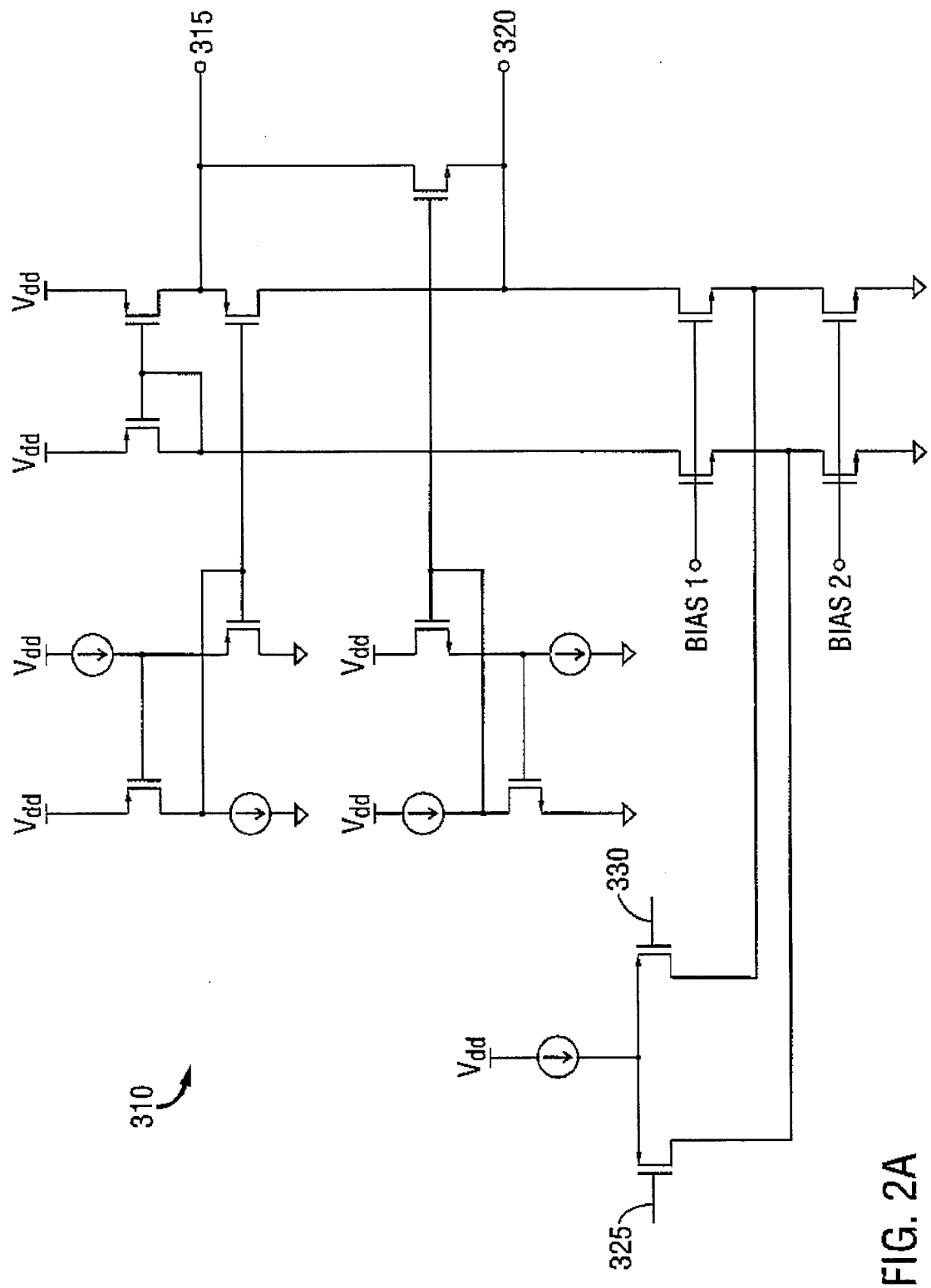
FIG. 2A is schematic of a portion of the block diagram of FIG. 2.

A controlled impedance amplifier circuit 300 according to the present invention is illustrated in FIG. 2. The amplifier circuit 300 includes a differential input gain block 310, which may be for example, an internal fully differential input amplifier. The differential gain block 310 has two voltage outputs 315 and 320. An example of a differential input gain block which may be utilized for gain block 310 is shown in FIG. 2A. However it will be recognized that other approaches may be utilized, for example, as described in the IEEE Journal of Solid State Circuits, "Low Output Impedance Fully Differential Op Amp," Joseph N. Babanezhad, December 1991, p. 1825–1833.

As shown in FIG. 2, voltage output 315 controls the two p-channel output devices 345 and 347 which are capable of sourcing currents and the voltage output 320 controls two n-channel output devices 355 and 357 which are capable of sinking currents. The two outputs 315 and 320 are linked through biasing to maintain a quiescent current in the output. Depending on whether current is to be sourced or sinked, voltage output 315 or 320 provides control. Output devices 345 and 355 cascoded by devices 346 and 356 form one current output, while output devices 347 and 357 form the second output. Each current output is capable of sourcing or sinking current. The input signal for amplifier circuit 300 is a current source applied at the inverting input 325 of the amplifier circuit 300. As shown in FIG. 2, the inverting input 325 of the amplifier circuit 300 is connected to the non-inverting input of the differential gain block 310. Likewise, the non-inverting input 330 of the amplifier circuit 300 is connected to the inverting input of differential gain block 310. This reversal of polarities is required due to the inverting operation of the output stages of amplifier circuit 300.

The amplifier circuit 300 has a p-channel output side 340 and a n-channel output side 350. Though the amplifier circuit 300 is shown with both an n-channel and p-channel side, it will be appreciated that the present invention may be utilized with only one or the other side of transistors. The p-channel side 340 of the amplifier circuit 300 includes a first output stage 341 and a second output stage 342. The first output stage 341 provides an output to output line 343 while the second output stage 342 provides an output to output line 344. Likewise, the n-channel side 350 has a first output stage 351 connected to an output line 353 and a second output stage 352 connected to an output line 354. The first output stage 341 of p-channel side 340 includes p-channel transistor 345 cascoded by p-channel transistor 346. The second output stage 342 includes p-channel transistor 347. The first output stage 351 of the n-channel side 350 includes n-channel transistor 355 cascoded by n-channel transistor 356. The second output stage 352 of the n-channel side 350 includes n-channel transistor 357. The drains of transistors 347 and 357 are connected to an output node 360. The source of transistor 347 is connected to a voltage source Vdd, while the source of transistor 357 is connected to ground. The source of the p-channel transistor 345 is also connected to Vdd and its drain is connected to the source of p-channel transistor 346. The source of the n-channel transistor 355 is connected to ground and the drain of transistor 355 is connected to the source of transistor 356. The drains of transistors 346 and 356 are tied together to the inverting input 325 of the amplifier circuit 300 (i.e. the noninverting input of the differential gain block 310). The gates of transistors 345 and 347 are controlled by the output line 315 while the gates of transistors 355 and 357 are controlled by the output line 320.

A feedback resistor 366 ($R_f$) is connected between the output voltage node 360 and the inverting input 325 of amplifier circuit 300, thus providing feedback impedance between the second output stage and the input to the amplifier circuit 300. Also connected between the first and second output stages of the p-channel side 340 is an error amplifier 370. The inverting input of the error amplifier 370 is connected to the first output stage 341 at the drain of transistor 345 while the non-inverting input of error amplifier 370 is connected to the second output stage 342 at the drain of transistor 347. The output of the error amplifier 370 controls the gate of the p-channel transistor 346. As shown in FIG. 2, a second error transistor 375 is similarly connected between the first and second output stages of the n-channel side 350 of the amplifier circuit 300.

Figure 3B:
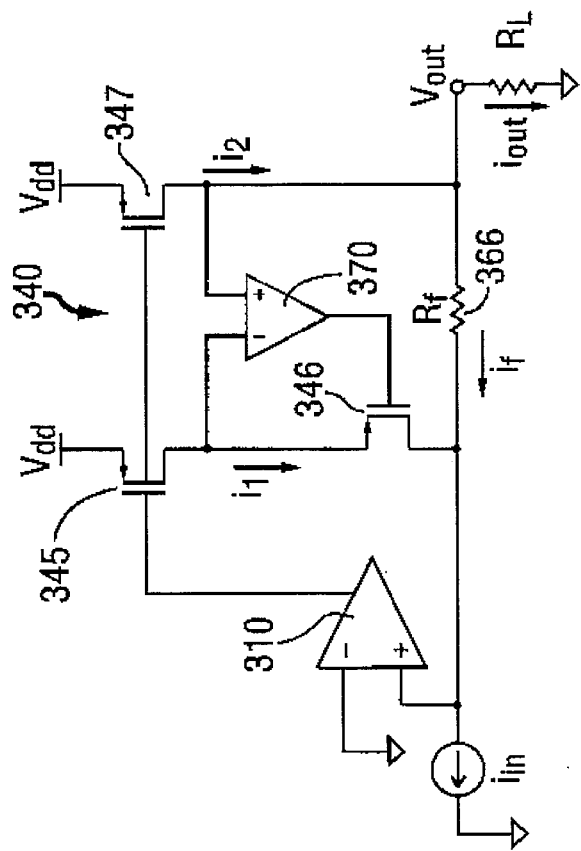
FIGS. 3(a) and 3(b) are equivalent circuits of the p-channel side of the amplifier shown in FIG. 2.
Figure 3A:
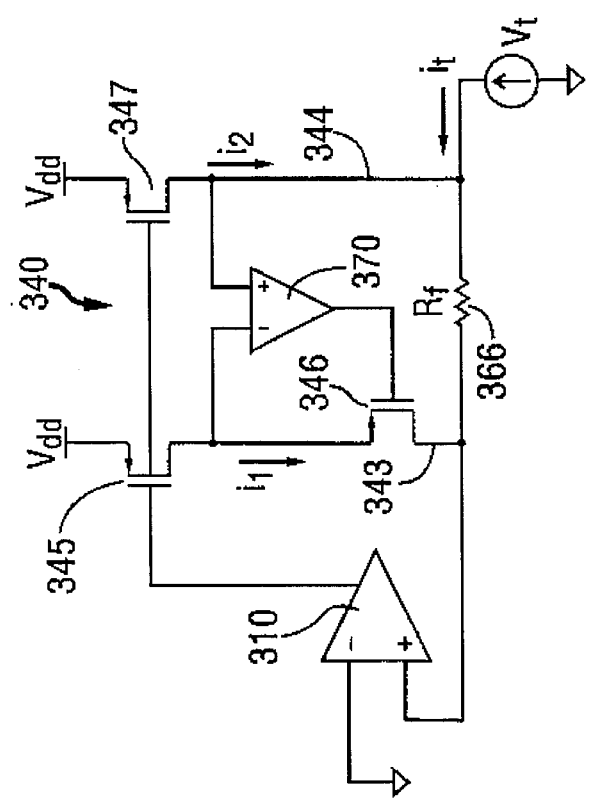

To simplify the analysis of the amplifier circuit 300, the operation of the amplifier circuit 300 will be discussed with reference to only the p-channel side 340 and with the Vcm signal source zeroed. Thus, the simplified circuit includes the circuitry as shown in FIGS. 3(a) and 3(b). When sourcing current, the p-channel side 340 of the circuit drives the output with a current of $I_{out}$ (as shown in FIG. 3(b)). FIG. 3(a) shows the equivalent circuit for the evaluation of the output impedance. Here, the input current source is replaced with an open circuit and a test voltage $V_t$ is applied at the output. In the following equations B is the current feedback ratio.

$B = i_1/i_2$ $i_f = -(i_2+i_1) = -(B+1)i_2$ $v_t = -i_1 * R_f = -B\ i_2 * R_f$ $R_{out} = v_t/i_f = (Bi_2*R_f)/[(B+1)*i_2] = [B/(B+1)]*R_f$     [Eq. 1]

Thus, the output impedance is a function of the feedback resistor and the ratio of the current in the first and second outputs.

Turning now to FIG. 3B, it can be shown that:

$i_{in} = i_f + i_1$; where $i_f = v_o/R_f$, and $i_1 = B\ i_2$ $i_{in} = v_o/R_f + B\ i_2$; where $i_2 = i_{out} + v_o R_f$ $i_{in} = v_o/R_f + B*(i_{out} + v_o R_f)$; where $i_{out} = V_o/R_L$ $i_{in} = [(v_o/R_f)*(B+1)] + (v_o/R_L)*B$     [Eq. 2]

From equation 1 it is concluded that in order for the amplifier's output impedance $R_{out}$ to match the line impedance $R_L$ one needs:

$R_f = [(B+1)/B] * R_L$     [Eq. 3]

Now substituting equation 3 for $R_f$ in equation 2:

$i_{in} = 2(v_o/R_L) * B$ and the transresistance gain of the circuit is:

$$v_o/i_{in} = R_1/2B \quad \text{[Eq. 4]}$$

For output devices with the same length and width, selection of B can be done by proper selection of the device multiplicity factor m. Provided that both output devices have the same vds, the equation for B becomes:

$$B = i1/i2 = m1/m2 \quad \text{[Eq. 5]}$$

where m1 is the multiplicity of the first output device and m2 is the multiplicity of the second output device. In this case B is only a function of device multiplicities. Since the multiplicity is a process independent and constant parameter, the value of B can be precisely selected. But, in the absence of error amplifier 370, and the cascode device 346, the voltage at the first output line 343 is fixed while the second output voltage line 344 (which is the amplifier's output voltage), is varying, or in other words the vds of first output device 345 is fixed and vds of second output device 347 is varying with output signal. Since the current in each device is also a function of its vds, the difference in vds's of first and second outputs results in a different value of B and therefore a different output impedance which is also a function of device gds. Thus, $$B = m1(ids + vds1 \times gds)/m2(ids + vds2 \times gds) \quad \text{[Eq. 6]}$$

Unlike multiplicity, gds is process dependant and not very controllable. So if the output device vds values are different, the value of B and output impedance can not be precisely determined. Equation 6 indicates that in order to make B depend on only m1 and m2, either vds1 and vds2 must match, or gds must be small enough so that vds1×gds and vds2×gds are much smaller than ids. In situations where small gds is not practical (because small gds requires long channel lengths which result in large devices and capacitances), another approach is desirable to match vds1 and vds2.

Figure 4:
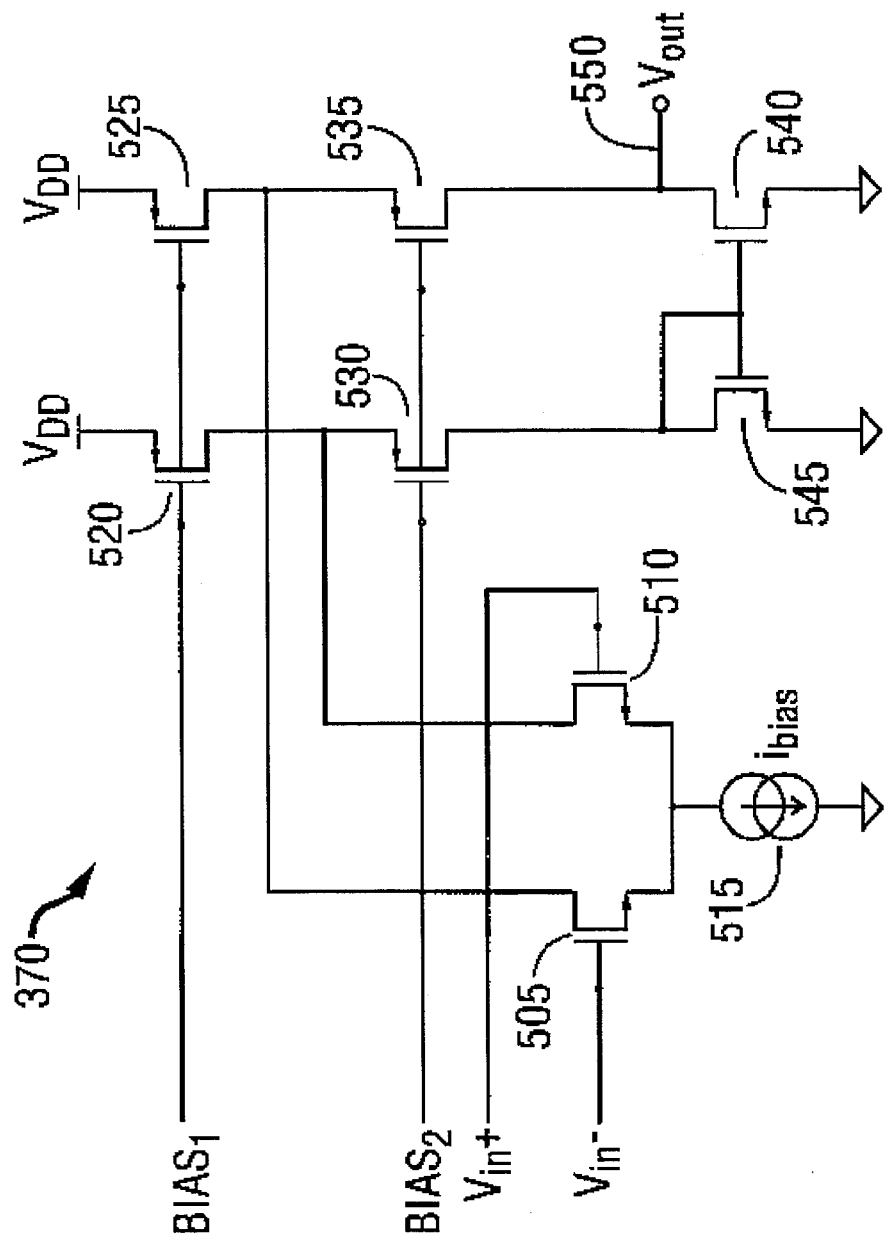
FIG. 4 shows the error amplifier used for the p-channel side of the amplifier shown in FIG. 2 to for tracking of output voltages.

An example of one amplifier that may be utilized as error amplifier 370 is shown in FIG. 4. However, other amplifier designs may be utilized for error amplifier 370 to achieve the benefits of the present invention which include the use of an error amplifier connected between the output stages to control the output impedance of the amplifier circuit 300. The embodiment of the p-channel error amplifier 370 shown in FIG. 4 includes a pair of n-channel differential input transistors 505 and 510 which have their sources tied to a current sink 515 that sinks current to ground. The drain of input transistor 505 is connected to the drain of p-channel transistor 525 and the source of p-channel transistor 530. Likewise, the drain of input transistor 510 is connected to the drain of p-channel transistor 520 and the source of p-channel transistor 530. The sources of p-channel transistors 520 and 525 are tied to a voltage source Vdd. The gates of transistors 520 and 525 are controlled by first bias voltage while the gates of transistors 530 and 535 are controlled by a second bias voltage. The output 550 of error amplifier 370 (which controls the gate of transistor 346 as shown in FIG. 4) is connected to the common drain node of p-channel transistor 535 and n-channel transistor 540. The gate of n-channel transistor 540 is tied to the gate and drain of n-channel transistor 545. The drain of n-channel transistor 545 shares a common node with the drain of p-channel transistor 530. The sources of n-channel transistor 545 and 540 are both tied to ground.

The p-channel error amplifier 370 shown in FIG. 4 in conjunction with the cascode device 346 attempts to force the drain voltage of the first output device 345 to track the drain voltage of the second output device 347. Looking at FIG. 2, it is noted that the summing junction of the amplifier 300 is at a common mode voltage Vcm. Thus, the drain voltage of the cascode device 346 is also equal to Vcm. In order to maintain the p-channel cascode device 346 in saturation, its source voltage must be larger than its drain voltage by at least one Von of the device. For output voltages near (within one Von of the cascode device 346) or below the common mode voltage, the cascode device is no longer saturated and the drain voltage of the first output's device does not track the second output's drain voltage. But when the output voltage is near or below the common mode voltage, the p-channel side is providing a small output current and therefore its gds is very small and does not play a significant role in the value of B.

An example of an amplifier to utilize as the n-channel error amplifier 375 is shown in FIG. 5. Once again, other amplifier design may be chosen while the benefits of the present invention will still be obtained. The design of error amplifier 375 is similar to the design of error amplifier 370 except for the reversal of the p-channel and n-channel transistors and the accompanying design changes needed to implement such changes. Thus, error amplifier 375 includes a p-channel input differential pair of transistors 605 and 610 having their sources tied to a current source 615. The drains of input transistors 605 and 610 are connected to n-channel transistors 620, 625, 630, and 635. The drains of transistors 630 and 635 are connected to p-channel transistors 640 and 645. The output voltage line 650 of error amplifier 375 controls the gate of transistor 356 as shown in FIG. 2. The operational analysis of the p-channel error amplifier 370 described above similarly applies to the n-channel error amplifier 375 when the amplifier 300 is sinking current.

The amplifier circuit 300 may also be used in a differential output mode as shown in FIG. 6. Thus, in FIG. 6, two controlled impedance amplifiers 300A and 300B with complimentary signals may be used. Each amplifier 300A and 300B may be an amplifier circuit 300 according to the present invention and as described above. Amplifier 300A has a positive output 701 while amplifier 300B has a negative output 702, and each output is connected to the load 705. In this configuration, each amplifier 300A and 300B should have an output impedance equal to one half of the line impedance.

Figure 7:
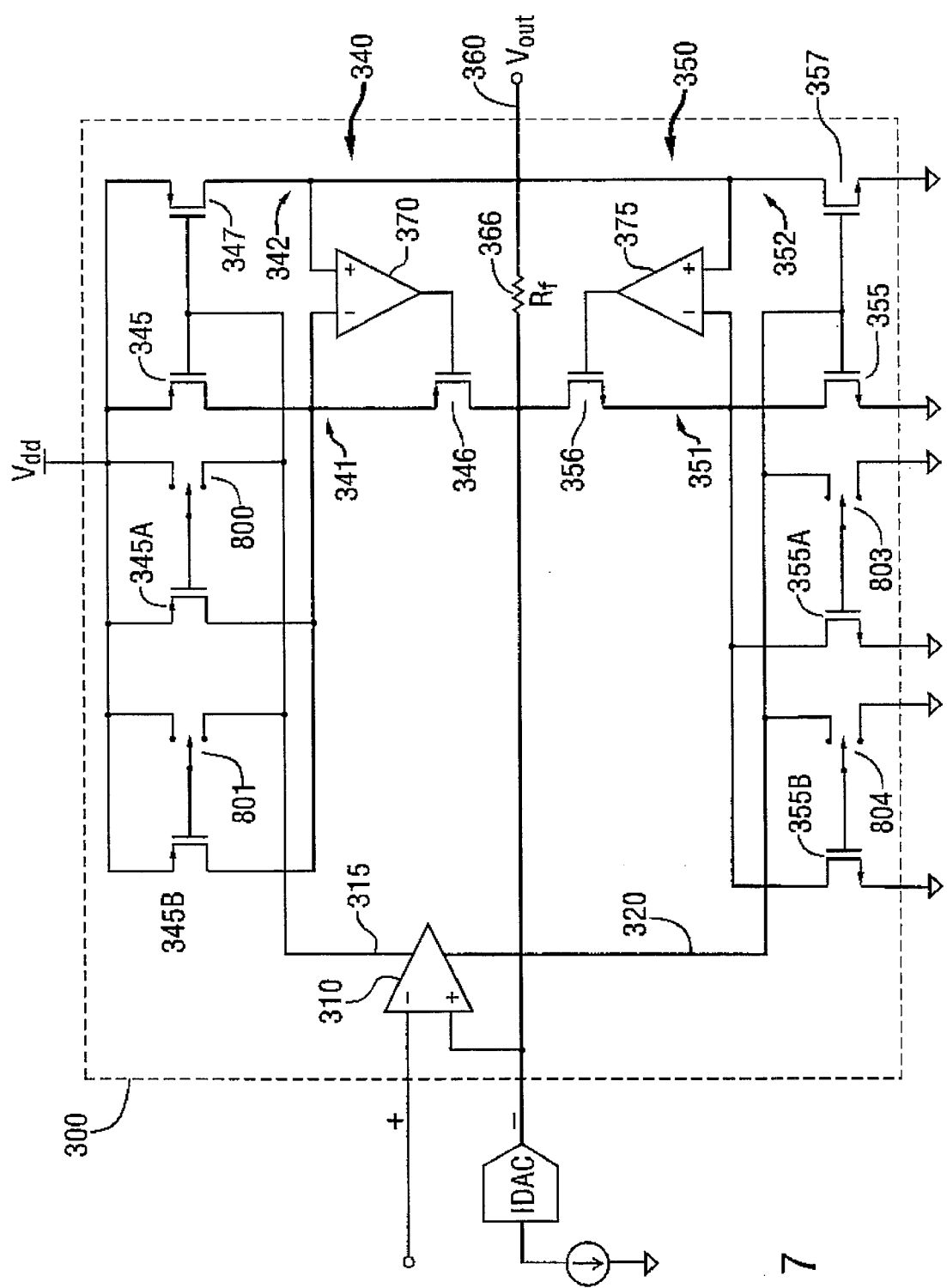
FIG. 7 shows the current feedback ratio switching scheme of a digitally controlled impedance amplifier of the present invention.
Figure 8A:
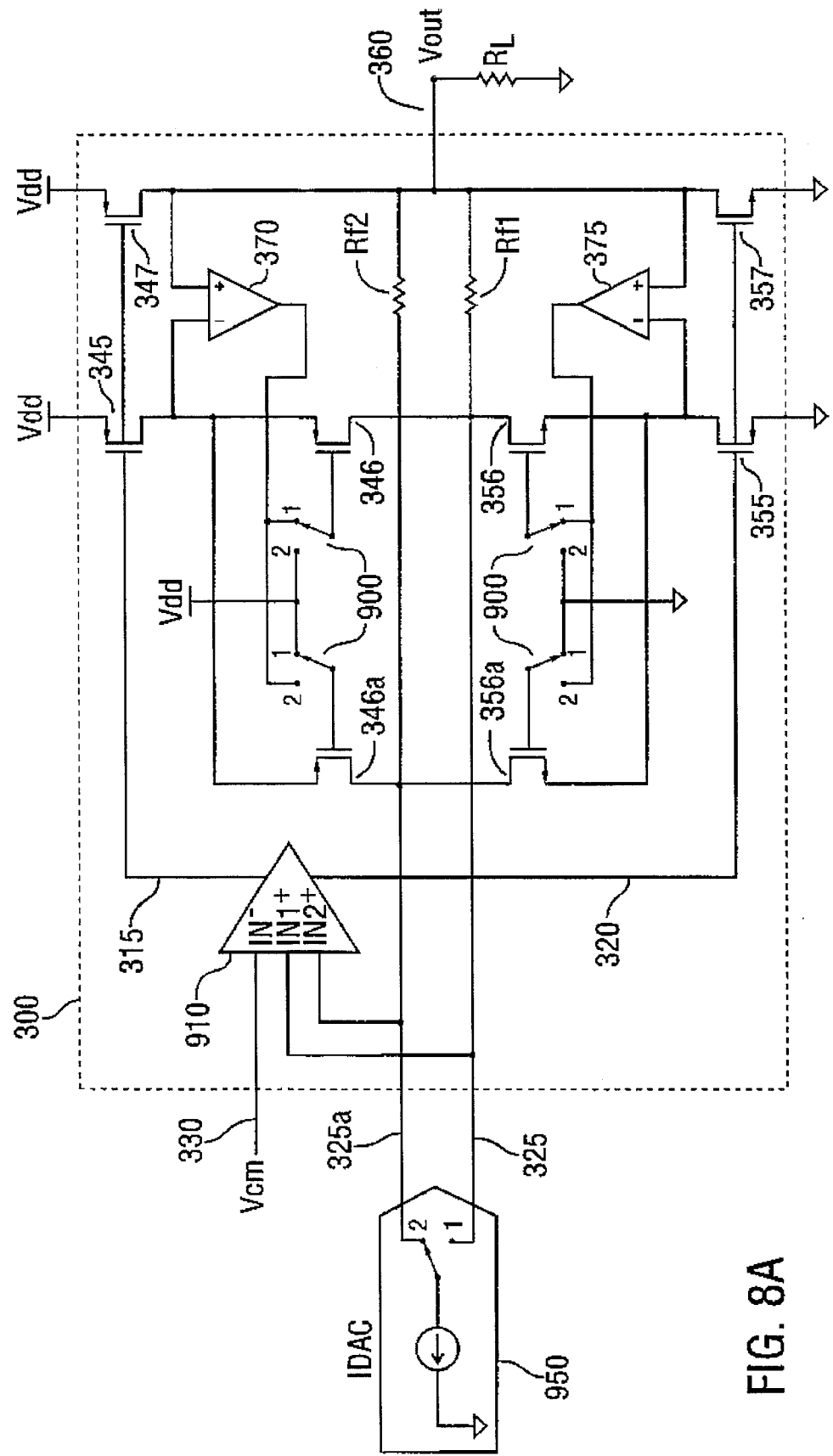
FIGS. 8(a) and (b) show the feedback resistor switching of a digitally controlled impedance amplifier of the present invention.
Figure 8B:
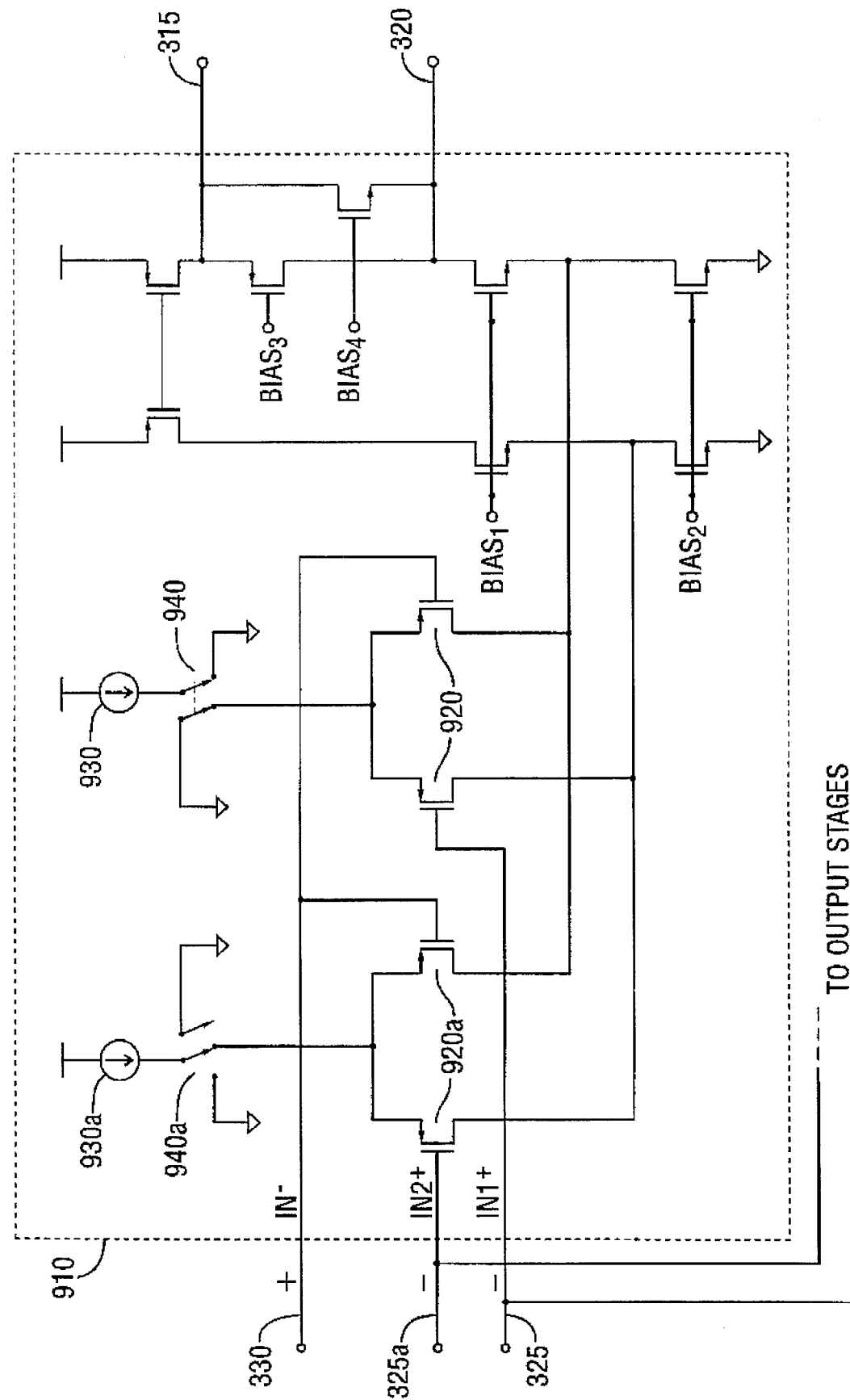

The amplifier of the present invention as described above may also be provided with circuitry which can be easily programmed for controlling the amplifier output impedance to match various line impedances. Thus, the output impedance may be programmed without having to make external hardware changes to change the output impedance. FIGS. 7, 8(a), and 8(b) illustrate the circuitry which may be utilized for digitally controlling the output impedance of amplifier circuit 300. FIG. 7 illustrates the output stages of amplifier circuit 300 as utilized in a digitally controlled output impedance mode. FIG. 7 includes both the p-channel side 340 and the n-channel 350 of the amplifier circuit 300. Also included are the first and second output stages of each side. Similar to FIG. 2, as shown in FIG. 7 the first output stage 341 includes p-channel transistors 345 and 346 while the first output stage 351 includes n-channel transistors 356 and 355. Likewise, the second output stage 342 includes p-channel transistor 347 while the second output stage 352 includes n-channel transistor 357. The p-channel error amplifier 370 is connected between the first output stage 341 and the second output stage 342. The n-channel error amplifier 375 is connected between the first output stage 351 and the second output stage 352 of the n-channel side 345.

Because the current feedback ratio (B) is dependent upon the current through each output stage, by changing the size of the transistor in the second output stage such as transistor 347 or the size of transistor 345 in the first output stage the value of the current feedback ratio may be modified. Thus, digitally selecting the size of the transistors 345 and/or 347 will result in a digital selection of the current feedback ratio. As shown in the embodiment in FIG. 7, digital selection of the transistor in the first output stage, transistor 345 is provided while the size of the second transistor 347 is fixed. It will be recognized, though, that transistor 347 may also be digitally selectable in conjunction with a digital selectable transistor 345 or transistor 347 may be digitally selected while the size of transistor 345 is fixed.

As shown in FIG. 7, the device size for the first output stage may be digitally selected between four values. The digital selection may be achieved by adding two additional transistors 345A and 345B in parallel with transistor 345. Connected to the gate of transistor 345A is a switch 800 while connected to the gate of transistor 345B is a switch 801. To obtain a first device size, the device size is merely the device size of transistor 345. In this mode, switches 800 and 801 are tied to $V_{dd}$ such that the gates of transistor 345A and 345B are not connected to the output line 315 of the differential gain block 310. Similarly the switches may be utilized to create three other device sizes by switchably selecting the combinations of transistors 340 and 345A, 340 and 345B, or 345, 345A, and 345B by connecting the gates of the selected transistors to output line 315. The digital selection of the device size for the first output stage described above with regards to p-channel side 340 similarly applies to the n-channel side 350 and the transistor 355A, transistor 355B, switch 803, and switch 804 by selectively switching the gates of the transistors to either ground or output line 320. It will be recognized from equation 4 above that the gain is also a function of the current feedback ratio. Thus, when changing the current feedback ratio the input current should also be scaled accordingly. This may be accomplished by scaling the input current by using a multiplying current digital to analog converter (IDAC) such as IDAC 820 shown in FIG. 7. The IDAC utilized may be any multiplying current digital to analog converter. It is simply desired that the input current is scaled according to the change in feedback ratio.

To provide a wider output impedance selection range, the feedback resistance value may also be digitally controllable. As described with reference to FIGS. 8A and 8B feedback resistors having different values may be selectively used for the feedback resistance. The control of the value of the feedback resistor may be used together with the digital selection of the output stage device as shown in FIG. 7. In such a case, the value of resistor 366 in FIG. 7 may be digitally controllable. Alternatively, the digital control of the feedback resistor 366 may be used independently of the digital control in the output stage such as in a circuit shown in FIG. 2. Though a specific embodiment for varying the feedback resistor is shown in FIGS. 8A and 8B without the digital control of the device sizes in the output stages for simplicity of the drawings, it will be recognized that the two mechanisms for digitally controlling the output impedance may be used together or separately.

As shown in FIG. 8A, one of two feedback resistors, $R_{f1}$ and $R_{f2}$, may be selected. Associated with each resistor is a corresponding transistor in the first output stage. Thus, as shown in FIG. 8A, transistors 346 and 356 are connected to feedback resistor $R_{f1}$ and transistors 346A and 356A are connected to feedback resistor $R_{f2}$. The gates of transistors 346, 346A, 356 and 356A are connected to switches 900. Each switch 900 has a node 1 and a node 2 as shown. When feedback resistor $R_{f1}$ is selected, each switch is selected to connect the transistor gates to each node 1 and similarly when feedback resistor $Re_2$ is selected, each switch is selected to connect the transistor gates to each node 2. Thus, the appropriate transistors and feedback resistors will be selected for operation with the error amplifiers depending on the selective control of the user.

In a preferred embodiment, each feedback resistor is associated with a different input differential transistor pair within the differential gain block 910. To select a resistor, the corresponding differential pair is turned on. Multiple pairs of transistors are used to avoid having to add switches in series with the feedback resistors. Differential gain block 910 is shown in more detail in FIG. 8B. The differential gain block has outputs 315 and 320, noninverting input 330, and inputs 325 and 325A. Input 325 is connected to feedback resistor $R_{f1}$ while input 325A is connected to feedback resistor $R_{f2}$. Input 325 is connected to a first pair of differential input transistors 920 while input 325A is connected to a second pair of differential input transistors 920A. The differential input transistor pairs are also connected to current sources 930 and 930A which may be selectively switched via switches 940 depending upon which feedback resistor is selected. Thus, switches 940 are set such that if feedback resistor $R_{f1}$ is selected current is provided from current source 930 to input transistor pair 920. Likewise, if feedback resistor $R_{f2}$ is selected current is provided from current source 930A through switches 940A to input transistor pair 920A.

Though the selection of feedback resistors is shown herein as a choice between two resistors, it will be recognized that three or more resistors may be utilized if additional accompanying switching circuitry is also provided. Further, as with the digital control of the output stages as described with reference to FIG. 7 above, with the selectable feedback resistance the gain changes as a different resistor is switched in. Thus, a multiplying IDAC 950 would be used to scale the current accordingly. The IDAC would be connected to input lines 325 and 325A and the current supplied to the input associated with the selected feedback resistor.

Figure 9:
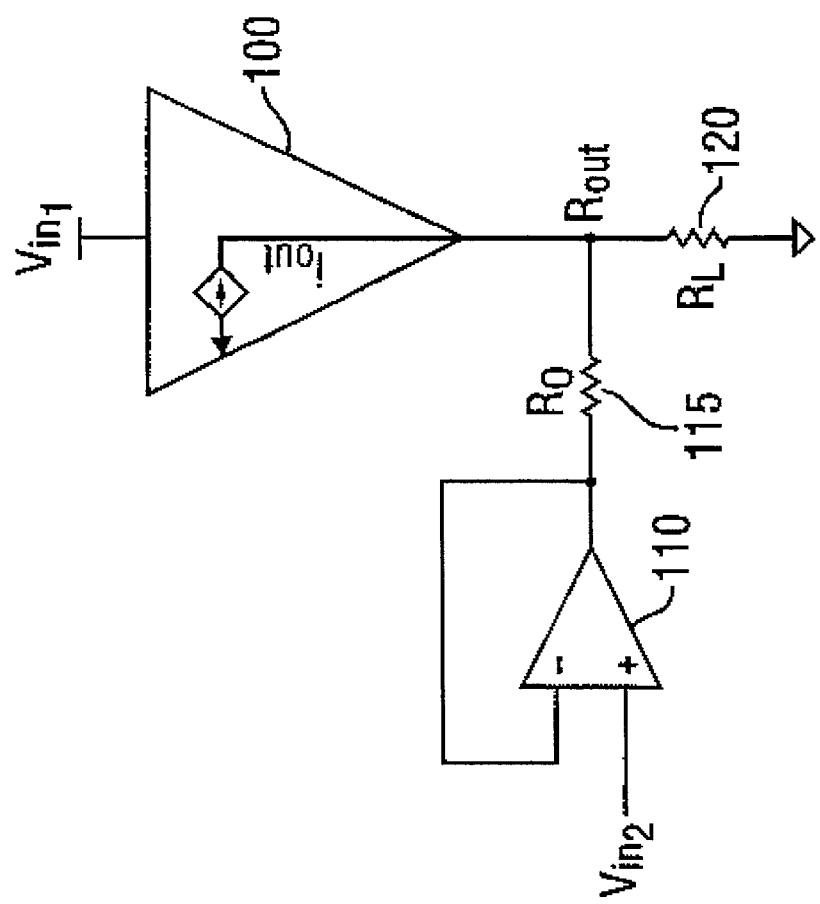
FIG. 9 is a block diagram of an amplifier with controlled output impedance having two input signals, one for a current amplifier and one for a voltage amplifier.

FIG. 9 shows an alternative technique for creating a controlled impedance driver. This approach uses a current out amplifier 100 to provide the load current and a voltage out amplifier 110 with a series resistance 115 to create the desired output impedance. The voltage amplifier creates a voltage equal to the desired output voltage so that in the absence of reflected signals, there is no current flow through the resistor 115. All of the current from the current amplifier flows through the load 120 ($R_L$) and power is not wasted, while the overall output impedance is the output impedance of the current amplifier ($R_i$) in parallel with the series combination of the output impedance of the voltage amplifier ($R_v$) and the resistor 115 ($R_o$). Further, ideally the overall output impedance is approximately equal to $R_o$ because generally $R_o$ is much greater than the output impedance of the voltage amplifier and much smaller than the output impedance of the current amplifier. This technique utilizes two input signals, one for the current amplifier and one for the voltage amplifier. Furthermore, to be able to use such an amplifier with different transmission lines or transformers, its output impedance should be programmable. Because the output impedance is primarily a function of the resistor 115, programmability of the output impedance would utilize switching of the resistance of resistor 115. For small resistor values, the switch resistance may cause errors in the actual resistance value. Yet another technique may be utilized similar to the circuit shown in FIG. 9, except without the use of resistor 115. In this technique, a current amplifier such as amplifier 100 may be utilized; however, amplifier 110 would be a small signal transconductance amplifier in which the transconductance is variable. In this case, the variable transconductance would set the output impedance.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that forms of the invention herein shown and described are to be taken as illustrative embodiments. Various changes may be made in the type and arrangement of the parts and components. Equivalent elements may be substituted for those illustrated and described herein, and certain features of the invention may be utilized independently of the use of other features, all as would be apparent to one skilled in the art after having the benefit of this description of this invention. For example, it will be recognized by one skilled in the art that the invention is not limited to the specific use of n-channel and p-channel transistors as shown, but rather, the use of n-channel and p-channel transistors may be interchanged utilizing standard design techniques. Further, the specific error amplifiers shown may be replaced with alternative amplifier designs.

What is claimed is:

1. An amplifier circuit comprising:
   (a) at least one amplifier circuit input;
   (b) a differential gain circuit connected to said amplifier circuit input;
   (c) a first output stage coupled to said amplifier circuit input, said first output stage comprising a first output;
   (d) a second output stage for providing an output signal from said amplifier circuit, said second output stage comprising a second output;
   (e) a feedback impedance coupled between said second output stage and said amplifier circuit input; and
   (f) a first error amplifier coupled between said first output stage and said second output stage;
   wherein an output impedance of said amplifier circuit is a function of the value of said feedback impedance.

2. The amplifier circuit of claim 1 wherein an output impedance of said amplifier circuit is a function of the ratio of the output currents at said first and second outputs.

3. The amplifier circuit of claim 2 wherein a value of said feedback impedance is variable.

4. The amplifier circuit of claim 2 wherein said ratio of the output currents is variable.

5. The amplifier circuit of claim 2 wherein said first error amplifier helps ensure that a first voltage of said first output stage tracks a second voltage of said second output stage.

6. The amplifier circuit of claim 5 wherein a value of said feedback impedance is variable.

7. The amplifier circuit of claim 5 wherein said ratio of the output currents is variable.

8. The amplifier circuit of claim 5 wherein a value of said feedback impedance is variable and said ratio of the output currents is variable.

9. The amplifier circuit of claim 5 wherein a first input of said first error amplifier is coupled to said first output stage and a second input of said first error amplifier is coupled to said second output stage.

10. The amplifier circuit of claim 9, said first output stage comprising a first transistor and said second output stage comprises a second transistor, said first input of said first error amplifier coupled to first transistor and said second input of said first error amplifier coupled to said second transistor.

11. The amplifier circuit of claim 10, said first output stage further comprising a third transistor, a gate of said third transistor controlled by an output of said first error amplifier.

12. The amplifier circuit of claim 11, a gate of said first transistor and a gate of said second transistor both controlled by an output of said differential gain circuit.

13. The amplifier circuit of claim 12, said first, second and third transistors arranged so that said first and second transistors share a common source, a drain of said first transistor connects to said first input of said first error amplifier, a drain of said second transistor connects to said second input of said first error amplifier, a source of said third transistor connects to said drain of said first transistor and a drain of said third transistor connects to said amplifier circuit input.

14. An amplifier circuit comprising:
   (a) at least one amplifier circuit input;
   (b) a differential gain circuit connected to said amplifier circuit input;
   (c) a first output stage coupled to said amplifier circuit input, said first output stage comprising a first output;
   (d) a second output stage for providing an output signal from said amplifier circuit, said second output stage comprising a second output;
   (e) a feedback impedance coupled between said second output stage and said amplifier circuit input; and
   (f) a first error amplifier coupled between said first output stage and said second output state,
said amplifier circuit having a first output side and a second output side, said first side comprising and first error amplifier, said first output stage and said second output stage, said second side comprising:
   (i) a third output stage coupled to said amplifier circuit input;
   (ii) a fourth output stage for providing said output signal from said amplifier circuit, said feedback impedance coupled between said fourth output stage and said amplifier circuit input; and (iii) a second error amplifier coupled between said first output stage and said second output stage,
wherein an output impedance of said amplifier is function of the value of said feedback impedance and the ratio of the output currents at said first and second outputs, and wherein said first error amplifier helps ensure that a first voltage of said first output stage tracks a second voltage of said second output stage.

15. An amplifier circuit having a controlled output impedance comprising:
   (a) a differential gain block having a first input and a second input, said first input for receiving an input signal;
   (b) a first transistor having its gate connected to an output of said differential gain block, a source of said first transistor connected to a first reference potential, and a drain of said first transistor coupled to said second input;
   (c) a second transistor having its gate connected to said output of said gain block, a source of said second transistor connected to said first reference potential, and a drain of said second transistor coupled to an output of said amplifier circuit;

(d) a feedback impedance coupled between said output of said amplifier circuit and said second input; and (e) an first error amplifier coupled between said first transistor and said second transistor, (f) wherein the output impedance of said amplifier is a function of said feedback impedance and the ratio of current through said first transistor to the current through said second transistor.

16. The amplifier circuit of claim 15 wherein said first error amplifier helps ensure that a first voltage of said first transistor tracks a second voltage of said second transistor.

17. The amplifier circuit of claim 16, said first transistor coupled to said second input through a cascoded transistor, an output of said first error amplifier controlling a gate of said cascoded transistor.

18. The amplifier circuit of claim 17, said first error amplifier coupled between said first transistor and said second transistor by a first input connected to a drain of said first transistor and by a second input connected to a drain of said second transistor.

19. The amplifier circuit of claim 15 wherein said controlled output impedance is variable.

20. The amplifier circuit of claim 19 wherein a value of said feedback impedance is variable.

21. The amplifier circuit of claim 19 wherein said ratio of current is variable.

22. The amplifier circuit of claim 19 wherein said first error amplifier helps ensure that a first voltage of said first transistor tracks a second voltage of said second transistor.

23. An amplifier circuit having a controlled output impedance comprising:

(a) a differential gain block having a first input and a second input, said first input for receiving an input signal;

(b) a first transistor having its gate connected to an output of said differential gain block, a source of said first transistor connected to a first reference potential, and a drain of said first transistor coupled to said second input;

(c) a second transistor having its gate connected to said output of said gain block, a source of said second transistor connected to said first reference potential, and a drain of said second transistor coupled to an output of said amplifier circuit;

(d) feedback impedance coupled between said output of said amplifier circuit and said second input;

(e) an first error amplifier coupled between said first transistor and said second transistor; and (f) wherein the output impedance of said amplifier is a function of said feedback impedance and the ratio of current through said first transistor to the current through said second transistor, said amplifier circuit having a first output side and a second output side, said first side comprising said first error amplifier, said first transistor and said second transistor, said second side comprising:

(i) a third transistor having its gate connected to a second output of said differential gain block, and a drain of said first transistor coupled to said second input;

(ii) a fourth transistor having its gate connected to said second output of said gain block, and a drain of said second transistor coupled to said output of said amplifier circuit; and (iii) a second error amplifier coupled between said third transistor and said fourth transistor.

24. An amplifier circuit comprising:

(a) an internal amplifier providing an output voltage proportional to an input signal;

(b) a first transconductance amplifier coupled to said internal amplifier and having a first output for providing a first output current proportional to said output voltage, said first output coupled to a first input of said internal amplifier;

(c) a second transconductance amplifier coupled to said internal amplifier and having a second output for providing a second output current proportional to said output voltage;

(d) a feedback impedance coupled between said second output and said first input of said internal amplifier; and (e) an error amplifier coupled between said first transconductance amplifier and said second transconductance amplifier;

(f) wherein an output impedance of said amplifier is predominantly a function of said feedback impedance and a ratio of the transconductances of said first and second transconductance amplifiers.

25. The amplifier circuit of claim 24 wherein said error amplifier ensures that a first voltage of said first output stage tracks a second voltage of said second output stage.

26. The amplifier circuit of claim 25, said output impedance being a predetermined value.

27. The amplifier circuit of claim 25, said output impedance being variable.

28. The amplifier circuit of claim 27, said feedback impedance being variable and said ratio of the transconductances of said first and second transconductance amplifiers being variable.

29. A method of controlling an amplifier circuit comprising:

providing a differential gain circuit connected to an input of said amplifier circuit;

providing a first and second output stages coupled to said differential gain circuits;

connecting said second output stage to an output of said amplifier circuit;

connecting a feedback impedance between said second output stage and said input;

tracking a first voltage in said first output stage to a second voltage in said second output stage;

controlling an output impedance as a function of said feedback impedance and a ratio of the output currents of said first and second output stages.

30. The method of claim 29, said tracking step comprising connecting an error amplifier between said first and second output stages.

31. The method of claim 30 said controlling step further comprising varying said output impedance by digitally controlling said amplifier circuit.

32. The method of claim 31, said varying accomplished by varying said feedback impedance.

33. The method of claim 31, said varying accomplished by varying said ratio.

34. An amplifier circuit have a variable output impedance, comprising:

(a) a differential gain circuit connected to an amplifier circuit input;

(b) a first output stage coupled to said amplifier circuit input;

(c) a second output stage for providing an output signal from said amplifier circuit, said output impedance being a function of a ratio of output currents at said first output stage and said second output stage;

(d) at least one feedback impedance coupled between said second output stage and said amplifier circuit input, said output impedance being a function of said feedback impedance; and (e) wherein said output impedance may be varied by switchably changing said ratio or said feedback impedance.

35. The amplifier circuit of claim 34, said first output stage comprising a first transistor and said second output stage comprising a second transistor, said ratio being varied by varying a current through at least one of said first and second transistors.

36. An amplifier circuit have a variable output impedance, comprising:

(a) a differential gain circuit connected to an amplifier circuit input;

(b) a first output stage coupled to said amplifier circuit inputs;

(c) a second output stage for providing an output signal from said amplifier circuit, said output impedance being a function of a ratio of output currents at said first output stage and said second output stage;

(d) at least one feedback impedance coupled between said second output stage and said amplifier circuit input, said output impedance being a function of said feedback impedance;

(e) wherein said output impedance may be varied by switchably changing said ratio or said feedback impedance;

(f) said first output stage comprising a first transistor and said second output stage comprising a second transistor, said ratio being varied by varying a current through at least one of said first and second transistors;

(g) at least one switchable transistor, a drain and source of said switchable transistors being connected in parallel with a drain and source of either said first or second transistors; and (h) at least one switch connected to said switchable transistor, said switchable transistor providing additional current through either said first output stage or said second output stage to vary said ratio.

37. The amplifier circuit of claim 36, said at least one switchable transistor connected in parallel with said first transistor, said sources of said first transistor and said at least one switchable transistor being connected to a reference voltage, and said at least one switch being connected to a gate of said switchable transistor to selectively connect said gate to either said reference voltage or an output of said differential gain circuit.

38. The amplifier of claim 37 further comprising an error amplifier coupled between said first output stage and said second output stage.

39. An amplifier circuit have it variable output impedance, comprising:

(a) a differential gain circuit connected to an amplifier circuit input;

(b) a first output stage coupled to said amplifier circuit input;

(c) a second output stage for providing an output signal from said amplifier circuit, said output impedance being a function of a ratio of output currents at said first output stage and said second output stage;

(d) at least one feedback impedance coupled between said second output stage and said amplifier circuit input, said output impedance being a function of said feedback impedance;

(e) wherein said output impedance may be varied by switchably changing said ratio or said feedback impedance;

(f) said first output stage comprising a first transistor and said second output stage comprising a second transistor, said ratio being varied by varying a current through at least one of said first and second transistors; and a plurality of feedback impedances coupled between said second output stage and said amplifier circuit input, said feedback impedances having different values.

40. An amplifier circuit have a variable output impedance, comprising:

(a) a differential gain circuit connected to an amplifier circuit input;

(b) a first output stage coupled to said amplifier circuit input;

(c) a second output stage for providing an output signal from said amplifier circuit, said output impedance being a function of a ratio of output currents at said first output stage and said second output stage;

(d) at least one feedback impedance coupled between said second output stage and said amplifier circuit input, said output impedance being a function of said feedback impedance;

(e) wherein said output impedance may be varied by switchably changing said ratio or said feedback impedance; and (f) a plurality of feedback impedances coupled between said second output stage and said amplifier circuit input, said feedback impedances having different values.

41. The amplifier circuit of claim 40, said differential gain circuit comprising a plurality of differential input transistor pairs, each feedback impedance being associated with at least one input transistor pair.

42. The amplifier circuit of claim 40, further comprising an error amplifier coupled between said first output stage and said second output stage, each feedback impedance associated with at least one transistor of said first output stage, said at least one transistor selectively connectable to said error amplifier.

43. A method of varying the output impedance of an amplifier circuit comprising:

providing a differential gain circuit connected to an input of said amplifier circuit;

providing a first and second output stages coupled to said differential gain circuits, said second output stage connected to an output of said amplifier circuit;

connecting a feedback impedance between said second output stage and said input;

variably controlling the output impedance of said amplifier circuit as a function of said feedback impedance and a ratio of the output currents of said first and second output stages.

44. The method of claim 43 further comprising:

varying an output current of either said first or second output stages to vary said ratio.

45. A method of varying the output impedance of an amplifier circuit comprising:

providing a differential gain circuit connected to an input of said amplifier circuit;

providing a first and second output stages coupled to said differential gain circuits, said second output stage connected to an output of said amplifier circuit;

connecting a feedback impedance between said second output stage and said input;

variably controlling the output impedance of said amplifier circuit as a function of said feedback impedance and a ratio of the output currents of said first and second output stages;

varying an output current of either said first or second output stages to vary said ratio; and switchably adding at least one transistor to said first output stage to vary said output current.

46. The method of claim 45 further comprising:

varying said a value of said feedback impedance to vary said output impedance.

47. The method of claim 46 further comprising:

tracking with an error amplifier a first voltage in said first output stage to a second voltage in said second output stage.

48. The method of claim 43 further comprising:

varying said a value of said feedback impedance to vary said output impedance.

49. The method of claim 48 further comprising:

providing a plurality of feedback impedances, said output impedance varied by selectively connecting said feedback impedances between said second output stage and said input.

50. A method of varying the output impedance of an amplifier circuit comprising:

providing a differential gain circuit connected to an input of said amplifier circuit;

providing a first and second output stages coupled to said differential gain circuits, said second output stage connected to an output of said amplifier circuit;

connecting a feedback impedance between said second output stage and said input;

variably controlling the output impedance of said amplifier circuit as a function of said feedback impedance and a ratio of the output currents of said first and second output stages;

varying said a value of said feedback impedance to vary said output impedance;

providing a plurality of feedback impedances, said output impedance varied by selectively connecting said feedback impedances between said second output stage and said input; and providing at least one pair of differential input transistors within said differential gain circuit for each of said plurality of feedback impedance.

51. A method of varying the output impedance of an amplifier circuit comprising:

providing a differential gain circuit connected to an input of said amplifier circuit;

providing a first and second output stages coupled to said differential gain circuits, said second output stage connected to an output of said amplifier circuit;

connecting a feedback impedance between said second output stage and said input;

variably controlling the output impedance of said amplifier circuit as a function of said feedback impedance and a ratio of the output currents of said first and second output stages;

varying said a value of said feedback impedance to vary said output impedance;

providing a plurality of feedback impedances, said output impedance varied by selectively connecting said feedback impedances between said second output stage and said input;

tracking with an error amplifier a first voltage in said first output stage to a second voltage in said second output stage; and selectively connecting said error amplifier to a transistor, said transistor connected to a selected feedback impedance of said plurality of feedback conductances.

* * * * *

UNITED STATES PATENT AND TRADEMARK OFFICE
CERTIFICATE OF CORRECTION

PATENT NO. : 5,585,763
DATED : December 17, 1996
INVENTOR(S) : Navabi et al.

It is certified that error appears in the above-indentified patent and that said Letters Patent is hereby corrected as shown below:

In claim 36, column 13, line 20, delete "inputs" and insert --input-- therefor.

Signed and Sealed this

Fourth Day of March, 1997

BRUCE LEHMAN

*Attest:*

*Attesting Officer*     *Commissioner of Patents and Trademarks*

UNITED STATES PATENT AND TRADEMARK OFFICE
CERTIFICATE OF CORRECTION

PATENT NO. : 5,585,763
DATED : December 17, 1996
INVENTOR(S) : Navabi *et al.*

It is certified that error appears in the above-identified patent and that said Letters Patent is hereby corrected as shown below:

On the title page: Item [56], under U.S. PATENT DOCUMENTS, please delete "5,157,349 10/1992 Babenezhad" and insert --5,157,349 10/1992 Babanezhad-- therefor;

under OTHER PUBLICATION, please delete "Babenezhad" and insert --Babanezhad-- therefor.

Signed and Sealed this

First Day of April, 1997

*Attest:*

BRUCE LEHMAN

*Attesting Officer*  Commissioner of Patents and Trademarks